United States Patent [19]

Letize et al.

[11] Patent Number: 4,978,422

[45] Date of Patent: Dec. 18, 1990

[54] METHOD FOR IMPROVING INSULATION RESISTANCE OF PRINTED CIRCUITS

[75] Inventors: Raymond A. Letize, West Haven, Conn; David D. Sullivan, Springfield, Mo.; William R. Thomas, Fair Grove, Mo.; Thomas D. Murry, Springfield, Mo.

[73] Assignee: MacDermid, Incorporated, Waterbury, Conn.

[21] Appl. No.: 496,337

[22] Filed: Mar. 20, 1990

[51] Int. Cl.$^5$ .............................. C23F 1/00; B44C 1/22; C03C 15/00; C03C 25/06
[52] U.S. Cl. ......................................... 156/656; 134/2; 134/27; 134/29; 156/666; 156/902; 252/79.5
[58] Field of Search ............... 156/634, 656, 659.1, 156/666, 668, 902; 252/79.2, 79.5; 134/2, 22.13, 22.17, 27, 28, 29

[56] References Cited

U.S. PATENT DOCUMENTS

| | | | |
|---|---|---|---|
| 4,601,783 | 7/1986 | Krulik | 252/79.5 X |
| 4,601,784 | 7/1986 | Krulik | 252/79.5 X |
| 4,698,124 | 10/1987 | Krulik | 252/79.5 X |

*Primary Examiner*—William A. Powell
*Attorney, Agent, or Firm*—St. Onge Steward Johnston & Reens

[57] ABSTRACT

After the etching away of copper to selectively expose surface areas of insulating material in a printed circuit process based upon copper foil-clad insulating substrate material, the exposed surface areas of insulating material are contacted with an aqueous alkaline permanganate solution to remove from the areas residual metal species associated therewith so as to improve the electrical resistance afforded by those areas in the printed circuit.

10 Claims, No Drawings

METHOD FOR IMPROVING INSULATION RESISTANCE OF PRINTED CIRCUITS

BACKGROUND OF THE INVENTION

The present invention relates to the manufacture of printed circuits and, more particularly, to a process for improving the insulation resistance of printed circuit boards.

In the manufacture of printed circuits, a fundamental starting material is a planar insulating substrate material, typically composed of an epoxy resin and more typically a glass-reinforced epoxy resin, having a thin layer of copper foil adherently bonded to one or both of its surfaces. From this printed circuit board starting material, a variety of different types of processes can be carried out to selectively define on the surfaces those areas which will constitute the conductive circuitry of the printed circuit and those areas which will be non-conductive, and the hallmark of all such processes is an eventual etching of copper, including the original thin layer of copper foil, in selected areas to there expose the underlying insulating substrate.

In a typical process, for example, double-sided printed circuits are manufactured from a board comprised of an insulating substrate having a thin layer of copper foil adherently laminated to both its surfaces. Through-holes for conductive interconnection of circuitry on both sides of the board are drilled through the board and the board is electrolessly plated with copper to metallize the through-hole surfaces and provide additional copper over the copper foil. An organic plating resist (e.g., from the application, imaging and development of a photoresist) is then applied to board surfaces to provide a plating resist pattern in the negative of the desired circuitry pattern, and additional copper is selectively built up on the non-resist areas via electroplating. Thereafter, an etch-resistant material (e.g., tin-lead) is selectively electroplated onto the exposed copper areas not covered by the plating resist, and thereafter the plating resist is removed. The board is then treated with a copper etchant to etch away the copper areas which were previously covered by the plating resist, thereby arriving at a selective pattern of conductive circuitry and insulating substrate areas on the board surfaces. Typical processing steps thereafter may include reflow and fusing of the tin-lead, followed by selective application of a solder mask.

Critical to the functionality of printed circuits is the electrical integrity of the selective conductive paths and areas, as provided by the selective areas of insulating material which separates them on the planar board surface. To this end, the insulating material used in producing the copper foil clad substrates as the starting material in printed circuit manufacture is chosen to have a high electrical resistance. The surface of insulating material exposed after selective etching during the printed circuit manufacturing process generally exhibits somewhat less resistivity than the original insulating material itself, sometimes as a consequence of incomplete etching away of copper, but more commonly as a consequence of the presence on the surface of metal species from compounds (e.g., zinc and/or chrome compounds) employed by board manufacturers in the process of adhering the copper foil to the insulating substrate, which metal species are apparently so intimately associated with the board surface as to resist complete removal in the copper etching process.

The decreased resistivity of the insulating material surface brought about by the presence of these metal species can be tolerated in certain printed circuits where relatively large insulating areas separate conductive areas. However, the trend today is toward much more complex and dense circuitry patterns, and as a consequence poor resistivity of the insulating surface areas, and particularly latent conductive paths thereon resulting from retained metal species, can readily lead to undesired cross-talk and shorting between closely-spaced conductive areas.

SUMMARY OF THE INVENTION

It is a primary object of the present invention to provide a process for fabricating printed circuits from metal foil-clad insulating substrate materials, in which the electrical resistance of the insulating substrate material is maintained at a sufficiently high level so as to avoid problematical cross-talk and/or shorting between or among conductive areas of the printed circuit.

Another more specific object of the invention is to provide a process for removing, from an insulating substrate surface exposed in the etching of copper from a copper-clad insulating substrate material, metal species which otherwise reduce the resistance of the exposed insulating substrate surface.

These and other objects are provided by a process for fabricating printed circuits in which, after the selective etching of copper to expose surface areas of insulating substrate material, those exposed areas are contacted with an alkaline permanganate solution for a time sufficient to remove at least a portion of residual metal species from the exposed areas, followed by neutralization of manganese residues.

Generally, the contact with the alkaline permanganate solution is effected by immersion of the entire printed circuit in the solution for the requisite period of time, although other processes (e.g., spraying) may be employed, either to the entire board or, insofar as possible, selectively to the insulating surface areas to be treated. For potassium permanganate solutions, the concentration of potassium permanganate in the aqueous solution will generally be from about 20 to 100 g/l, while for sodium permanganate, it generally will be present at from 50 to about 150 g/l in the solution. The requisite alkalinity is generally that to achieve a solution pH of at least about 8.0, typically from about 8.0 to 13.0, and can be provided by any suitable source (e.g., sodium hydroxide). The solution will normally be employed at a temperature of from about 70° F. to about 120° F., and, depending upon the particular solution temperature and make-up, and the degree of removal of metal species desired or required, the contacting time can be on the order of seconds to minutes, e.g., from about 30 seconds to about 10 minutes.

Although not wishing to be bound by theory as such, it would appear that the contact with the alkaline permanganate removes a thin surface layer of the exposed insulating substrate material, and with it the metal species embedded in or otherwise associated with the surface layer.

DETAILED DESCRIPTION OF THE INVENTION

The process of the present invention is generally applicable to any metal-clad insulating substrate board material where the metal (e.g., copper foil) cladding has been adhered to the surface or surfaces of the substrate by means which involve metallic compounds such that, after etching to expose an insulating substrate surface, residual metal species result in a decrease of the resistance of the substrate surface and the potential for providing conductive paths which could lead to cross-talk and/or shorting between conductive areas separated from each other by the insulating surface. The insulating substrate material generally will be chosen so as to have an inherent resistance of at least about $10^8$ ohms, and a purpose of the invention is to arrange that, after steps for fabricating a printed circuit, the surface areas of this insulating substrate material which separate desired conductive areas will have a similarly high resistance value. The insulating substrate material can be any suitable dielectric, including thermosetting and thermoplastic polymers and resins, and most particularly is epoxy-based, typically with glass or other reinforcing fibers interspersed therein.

The process of the invention is generally applicable to any printed circuit fabrication technique wherein the copper foil cladding on the insulating substrate is eventually selectively etched away to provide insulating areas on the printed circuit. In some cases, the original copper foil cladding is the only metal selectively etched away in the process, while in most processes, the foil will have had built up thereon additional metal thickness by electroless and/or electrolytic processes, all as well known in the art, such that the selective etching down to the insulating substrate surface requires etching away of more than just the copper foil cladding at those areas.

Generally speaking, the contact of the exposed surface areas of insulating substrate material can be carried out at any time after the etching process has been completed, but for most typical processes, the contacting will follow the steps employed to condition and fuse the tin, lead or tin-lead etch resist and precede the application of solder mask. Obviously, however, there are a wide variety of printed circuit fabrication processes to which the present invention is applicable, and as a consequence there is an equally wide variety of possible and logical points in those processes where the process of the invention can, or will best be, carried out.

Neutralization of manganese residues which remain after the contacting with alkaline permanganate can be accomplished using any suitable compounds or compositions, e.g., a reducing agent such as hydroxylamine, sugars, bisulfite compounds, and the like, typically in solutions (preferably at least slightly acidic) permitting of immersion or spraying treatment.

The invention is further illustrated with reference to the following example.

EXAMPLE I

Double-sided copper foil-clad (1 oz.) glass-reinforced epoxy boards, in which the glass-reinforced epoxy material had a resistance of about $10^{10}$ ohms, were identically processed to provide through-holes therein and electrolessly plated with copper to metallize the through-hole surfaces and provide additional copper on the foil surfaces. The surfaces were then coated with a dry-film photoresist which was imagewise exposed and developed to provide on the board surfaces a selective pattern of plating resist. Additional copper (1.4 mils) was built up on the non-resist areas by electroplating, and the built up copper areas were thereafter provided with an etch-resistance layer of tin-lead (0.3 mils) by electroplating. Thereafter, the plating resist was stripped and the underlying layers of electroless copper and copper foil were etched away to selectively expose insulating substrate between the conductive areas (e.g., traces, pads, etc.) and thus form a pattern of desired circuitry. The boards were then treated to reflow the tin-lead electroplated layer followed by infrared fusing.

One board was thereafter conventionally processed, by rinsing, drying and application of solder mask. The printed circuit is tested at 95° F. in 95% RH for 96 hours, with a bias of 500 volts DC being placed on the board and measurements taken every 24 hours. Resistance readings for the exposed areas of insulating substrate material ranged from $10^6$ to $10^8$ ohms.

The other board was treated according to the invention, i.e., after the solder fusing, the board was immersed for two minutes in an alkaline permanganate solution (90° F.) containing 60 g/l potassium permanganate and 40 g/l 1N sodium hydroxide. Thereafter, the board was rinsed with water and immersed in an acidic solution of hydroxylamine to neutralize manganese residues, followed by drying and application of solder mask. Measurements of the resistance of the surface areas of insulating material ranged from $10^{11}$ to $10^{12}$ ohms.

The foregoing is provided to illustrate and describe the invention and particular preferred embodiments thereof, and is not to be taken as limiting the scope of the invention except as recited in the appended claims.

What is claimed is:

1. In a process for fabricating a printed circuit, wherein a printed circuit board composed of an insulating substrate material having a thin metal foil layer adhered to at least one planar surface thereof is selectively etched to produce a printed circuit having a predetermined pattern of conductive areas and insulating areas composed of said insulating substrate material, the improvement comprising contacting said insulating areas, after said etching, with an alkaline permanganate aqueous solution for a time and at conditions effective to remove from said insulating areas a sufficient quantity of metal species associated therewith so as to improve the electrical resistance afforded by said insulating areas in the printed circuit, and thereafter neutralizing residual manganese species on said printed circuit.

2. The process according to claim 1 wherein said thin metal foil layer is comprised of copper.

3. The process according to claim 2 wherein said insulating substrate material is comprised of an epoxy resin.

4. The process according to claim 3 wherein said insulating substrate material is comprised of glass-reinforced epoxy resin.

5. The process according to any of claims 1 to 4 wherein said alkaline permanganate aqueous solution contains from about 20 to about 150 g/l of permanganate and has a pH of from about 8 to about 13.

6. The process according to any of claims 1 to 4 wherein said neutralizing of residual manganese species comprises contacting with a reducing agent the areas of the printed circuit contacted with said alkaline permanganate aqueous solution.

7. The process according to any of claims 1 to 4 wherein said contacting of said insulating areas with an alkaline permanganate aqueous solution comprises immersion of the printed circuit in said alkaline permanganate aqueous solution.

8. The process according to any of claims 1 to 4 wherein said selective etching removes from said board said metal foil layer and electroless metal built up thereon in the fabrication of the printed circuit.

9. The process according to any of claims 1 to 4 wherein said conductive areas of said printed circuit comprise an outer-facing layer of tin-lead, and wherein said contacting of non-conductive areas with said alkaline permanganate aqueous solution after etching is carried out after reflow and fusing of said tin-lead layer.

10. In a process for fabricating a printed circuit, wherein a planar printed circuit board composed of an epoxy resin insulating substrate material having a thin layer of copper foil adhered to at least one planar surface thereof is selectively etched to selectively expose surface areas of said epoxy resin insulating substrate material to act as insulating areas on said printed circuit, the improvement comprising contacting said exposed surface areas of said epoxy resin insulating substrate material, after said etching, with an alkaline permanganate aqueous solution having a pH of at least about 8 and from about 20 to about 150 g/l of permanganate, for a time and at conditions effective to remove from said exposed surface areas of epoxy resin insulating substrate material a sufficient quantity of metal species associated therewith so as to improve the electrical resistance afforded by said insulating areas in the printed circuit, and thereafter neutralizing residual manganese species on said printed circuit.

* * * * *